(12) United States Patent
Sander et al.

(10) Patent No.: US 6,269,014 B1
(45) Date of Patent: Jul. 31, 2001

(54) HALF-BRIDGE CONFIGURATION

(75) Inventors: Rainald Sander; Chihao Xu; Josef-Matthias Gantioler, all of Munich; Frank Auer, Röhrmoos, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/627,180

(22) Filed: Jul. 27, 2000

(30) Foreign Application Priority Data

Jul. 27, 1999 (DE) .............................................. 199 35 100

(51) Int. Cl.$^7$ .............................................. H02M 7/5387
(52) U.S. Cl. .............................................. 363/132
(58) Field of Search ..................... 363/131, 132, 363/17, 98; 327/374, 375, 427, 432, 434; 257/337, 338, 401

(56) References Cited

U.S. PATENT DOCUMENTS

| 4,356,416 | * | 10/1982 | Weischedel | ........................ 327/375 |
| 4,969,020 | * | 11/1990 | Matsushita et al. | ................. 257/338 |
| 4,972,240 | * | 11/1990 | Murakami et al. | .................. 257/335 |
| 5,045,902 | * | 9/1991 | Bancal | ................................ 257/328 |
| 5,631,487 | * | 5/1997 | Hattori | ............................... 257/394 |
| 6,055,148 | * | 4/2000 | Grover | ................................ 361/103 |

* cited by examiner

*Primary Examiner*—Adolf Deneke Berhane
(74) *Attorney, Agent, or Firm*—Herbert L. Lerner; Laurence A. Greenberg; Werner H. Stemer

(57) ABSTRACT

In order to supply a load, e.g. an electric motor, with current bidirectionally, an H bridge configuration containing four switching transistors is used. In order to attain outstanding electrical conductivity and also thermal conductivity, a half-bridge configuration containing two transistors of opposite conductivity types is constructed. Each of the transistors is realized on a chip, the rear sides of which chips are seated on a common conductive support preferably produced from metal. Each housing is equipped with a support of this type. The rear side of each of the two chips is formed from a drain or source electrode of the transistors. A load can be connected to the support. Two half-bridge configurations can advantageously be combined to form an H bridge configuration.

13 Claims, 2 Drawing Sheets

HALF-BRIDGE CONFIGURATION

BACKGROUND OF THE INVENTION

FIELD OF THE INVENTION

The invention relates to a half-bridge configuration containing a first and a second transistor, where the two transistors are connected in series by their path electrodes. An operating voltage is present across the series circuit, and a load can be connected to the path electrodes of the two transistors, the path electrodes being connected to one another.

In order to be able to supply a load, e.g. an electric motor, with a bidirectional current for counterclockwise and clockwise rotation, a so-called H bridge configuration is used. An H bridge configuration is a bridge circuit containing four semiconductor switches, for example 4 MOSFETs, in which the load is located in the shunt path, and two transistors are connected in series by their path electrodes in each bridge path. A drive circuit enables the transistors to be controlled in such a way that the current flows through the load, e.g. the above-mentioned electric motor, in one direction or in the opposite direction. Depending on the current direction, the electric motor rotates in the clockwise or counterclockwise direction.

U.S. Pat. No. 5,703,390 discloses a semiconductor circuit configuration in which four MOSFETs which form a bridge are seated in an electrically insulated manner on an Si support. If large power switches are required in order to switch high currents, however, it is more cost-effective to distribute the power switches between a plurality of supports that are optimized in a function-specific manner.

Published, European Patent Application EP 0 809 292 A2 describes a power transistor module in which two transistors are disposed on a special electrically insulating substrate seated on a metal support. The two transistors are disposed in the above-mentioned half-bridge configuration.

The H bridge configuration disclosed in U.S. Pat. No. 5,703,390 and the half-bridge configuration disclosed in the Published, European Patent Application EP 0 809 292 A2 have the disadvantage that the electrical conductivity and the thermal conductivity are not optimal.

SUMMARY OF THE INVENTION

It is accordingly an object of the invention to provide a half-bridge configuration which overcomes the above-mentioned disadvantages of the prior art devices of this general type, in which the electrical conductivity and the thermal conductivity are as optimal as possible.

With the foregoing and other objects in view there is provided, in accordance with the invention, a half-bridge configuration, containing a load and two transistors having path electrodes, including a first transistor with a path electrode and a second transistor with a path electrode. The first transistor is connected in series with the second transistor by the path electrodes being connected to one another and defining a series circuit. An operating voltage can be impressed across the series circuit and the load is connected to the path electrodes of the two transistors. The two transistors are of opposite conductivity types and are formed as chips each having a rear side. A common electrically conductive support receives and supports the rear side of each of the chips such that the path electrode of the first transistor is connected to a same one of the path electrode of the second transistor. The common electrically conductive support forms a summation point, and the load is connected to one of the common electrically conductive support and the summation point.

The invention achieves the object by virtue of the fact that the two transistors are of opposite conductivity types, that each transistor is realized on a chip, and that the rear sides of the two chips are seated on a common electrically conductive support. This results in that the path electrode of the first transistor is connected to the same path electrode of the second transistor, and the conductive support forms a summation point, and that the load can be connected to the conductive support or to the summation point.

Each transistor is realized on a chip. Since, in the half-bridge configuration according to the invention, owing to the use of transistors of opposite conductivity types, in contrast to the known half-bridge configurations, identical path electrodes—the collectors or the emitters or, in the case of FETs, the drain electrodes or the source electrodes—rather than non-identical path electrodes are connected to one another. The rear sides of the two chips can be directly connected to one another, because they realize the same path electrodes. According to the invention, this connection is realized by virtue of the fact that the rear sides of the two chips are seated on a common electrically conductive support, e.g. made of metal. Optimum electrical and also thermal connection and conductivity for heat dissipation purposes are attained by the measure of placing the two chips on a common electrically conductive support.

In accordance with an added feature of the invention, the first transistor is a P-MOS field-effect transistor, the second transistor is an N-MOS field-effect transistor, and the path electrodes are drain electrodes. The drain electrode of the second transistor is connected to the drain electrode of the first transistor and to the common electrically conductive support.

In accordance with an additional feature of the invention, there is a drive circuit for generating control signals for controlling the two transistors. The two transistors each having a gate electrode connected to the drive circuit.

In accordance with another feature of the invention, the drive circuit is a chip disposed in an electrically insulated manner on one of the two transistors.

In accordance with another added feature of the invention, the chip forming the drive circuit is seated on that transistor of the two transistors which has a higher impedance. One of the two transistors is a P conductivity type and the chip forming the drive circuit IC is seated on the one of the two transistor of the P conductivity type.

In accordance with another additional feature of the invention, the common electrically conductive support is seated on the load for attaining an optimum electrical and thermal connection.

In accordance with a further added feature of the invention, the load has a first terminal and a second terminal, and in an unidirectional operation the second terminal of the load is connected to one of the operating voltage and ground.

In accordance with a further additional feature of the invention, the two transistors are constructed using vertical technology.

In accordance with yet another feature of the invention, there is a temperature monitoring circuit integrated in the chip forming the drive circuit for protecting the half-bridge configuration against destruction.

In accordance with a concomitant feature of the invention, there is a third transistor; and a fourth transistor connected in series with the third transistor and defining a further summation point at a connection point of the third transistor to the fourth transistor. The second terminal of the load is connected to the further summation point providing a bidirectional operation.

Other features which are considered as characteristic for the invention are set forth in the appended claims.

Although the invention is illustrated and described herein as embodied in a half-bridge configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
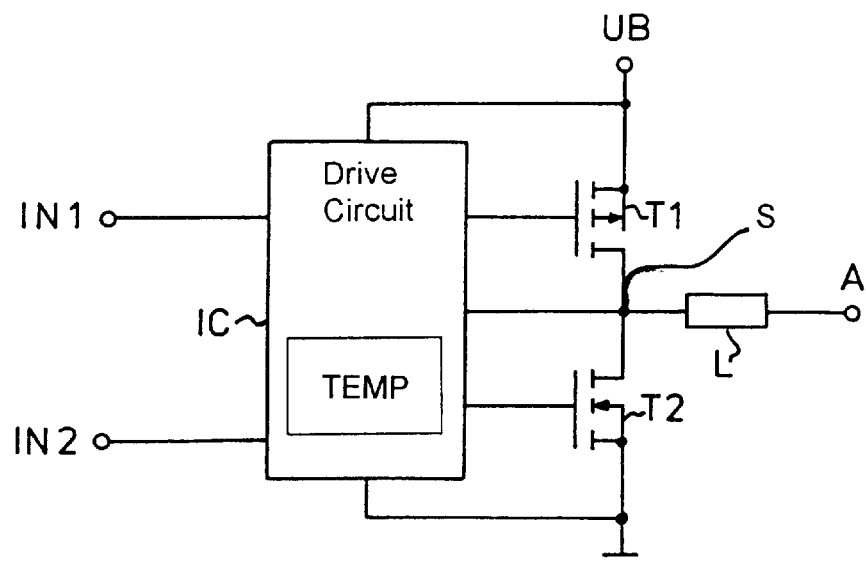
FIG. 1 is a block circuit diagram of a first exemplary embodiment of a half-bridge configuration according to the invention.

In all the figures of the drawing, sub-features and integral parts that correspond to one another bear the same reference symbol in each case. Referring now to the figures of the drawing in detail and first, particularly, to FIG. 1 thereof, there is shown two transistors T1 and T2, which are of opposite conductivity types and are connected in series. The transistor T1, whose drain electrode is connected to a drain electrode of the transistor T2, is a P-MOS field-effect transistor, for example, while the transistor T2 is an N-MOS field-effect transistor of the opposite conductivity type. An operating voltage UB is present at a source electrode of the transistor T1, while a source electrode of the transistor T2 is grounded. A first terminal of a load L is connected to the junction point between the drain electrodes of the two transistors T1 and T2, which forms a summation point S. The operating voltage UB is present at a second terminal A of the load L or the second terminal A of the load L is grounded. Gate electrodes of the two transistors T1 and T2 are connected to control outputs of a drive circuit IC, which controls the two transistors T1 and T2. The operating voltage UB is present at supply voltage inputs of the drive circuit IC, which has two control inputs. A control voltage IN1 is present at one control input and a control voltage IN2 is present at the other control input.

Figure 2:
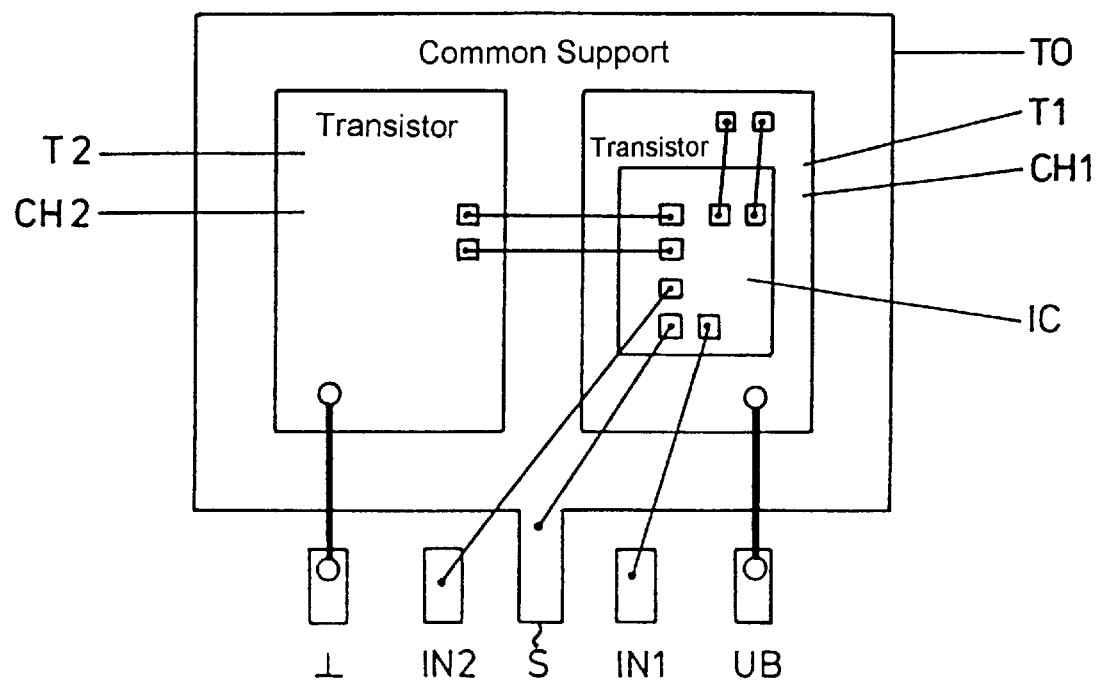
FIG. 2 is a block diagram of a second exemplary embodiment of the half-bridge configuration shown in FIG. 1 on a chip support.

The configuration of the circuit illustrated in FIG. 1 that is shown in FIG. 2 will now be described and explained.

The two transistors T1 and T2 are realized as chips CH1 and CH2, whose rear sides, which constitute the drain electrodes, are seated on a common conductive support TO, which may be produced from metal, for example. The drive circuit IC is likewise realized as a chip that is seated in an electrically insulated manner preferably on that transistor of the two transistors CH1, CH2 that has the higher impedance.

In this case, it is the P-MOS field-effect transistor T1, because a p-conducting transistor always has a higher impedance than an n-conducting transistor given the same chip area, for physical reasons. A connecting lug for the load L is provided on the support TO which forms the summation point S. In addition, the external terminals for the supply voltage UB, for ground and for the control voltage IN1 and IN2 are provided, which are connected by wire connections to the corresponding terminals of the drive circuit IC and of the two transistors T1 and T2.

It is particularly advantageous for the chip of the drive circuit IC to be disposed in an electrically insulated manner on the P-MOS field-effect transistor T1, the transistor of the two transistors T1 and T2 which has the higher impedance, because optimum thermal coupling between the chip of the drive circuit IC and the chip CH1 of the transistor T1 is thus attained.

In one refinement of the invention, the temperature in the chip is evaluated in the drive circuit IC by a temperature monitoring circuit TEMP. Since the chip of the drive circuit IC is seated on that transistor of the two transistors T1 and T2 which has the higher impedance, it responds earlier to an overtemperature condition and, by use of control signals, protects the entire configuration against destruction due to an overload condition.

The best electrical and thermal connection and, governed by this, a reliable, early response to overtemperature are attained if the support TO on which the chips CH1, CH2 and IC are seated, the chips CH1 and IC lying one above the other, is fixed to or on the load L. Since the support TO, the chip CH1 and the chip IC are disposed one above the other, there is excellent heat conduction from the load L as far as the topmost chip IC.

The control voltages IN1 and IN2 are simple logic signals that the drive unit IC converts into control signals for the two transistors T1 and T2. It prevents the simultaneous activation of the two transistors T1 and T2 and, moreover, can limit the current.

In contrast to an N-MOS field-effect transistor, the P-MOS field-effect transistor T1 can be driven rapidly and without any complexity, because neither a charge pump nor a bootstrap circuit is required for this purpose.

The two transistors T1 and T2 are preferably configured using vertical technology, a technology that is cost-effective but nonetheless exhibits the best electrical conductivity.

The invention requires only a small number of pins, because many connections between the three chips—the drive circuit IC and the two chips CH1 and CH2 of the two transistors T1 and T2—extend in the housing. Complex ESD protection is obviated for these internal connections.

It is particularly advantageous to provide the metallic support that each housing has for the support TO and the summation point S. All standard housings such as e.g. the standard housing TE220 are also suitable for this purpose.

A further advantage of the invention is that a plurality of half-bridges can be combined to form any desired configurations, thereby resulting in a great diversity of possible applications.

Figure 3:
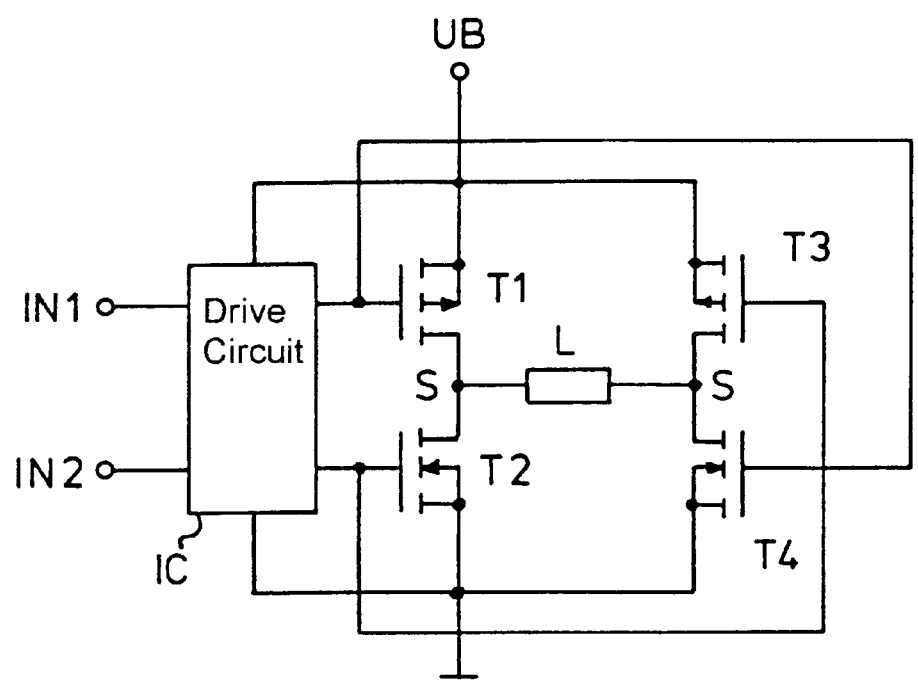
FIG. 3 is a block circuit diagram of a third exemplary embodiment of the invention with two half-bridge configurations.

One possible application is shown by the third exemplary embodiment of the invention illustrated in FIG. 3.

In FIG. 3, a second identical half-bridge configuration containing two transistors T3 and T4 is connected to the half-bridge configuration from FIG. 1 in such a way that an H bridge configuration is formed. The gate electrodes of the respectively diagonally opposite transistors T1 and T4, and T2 and T3, are connected to one and respectively to the other control output of the drive circuit IC. The load L is connected between the two summation points S. The supply voltage UB is present at the source electrodes of the two transistors T1 and T3, while the source electrodes of the two transistors T2 and T4 are grounded.

The invention is suitable for both unidirectional and bi-directional operation, if, in the last case, two half-bridge configurations according to the invention are combined with one another in a supplemented manner to form a bridge. Since in each case two chips forming a transistor are seated with their rear side on a common electrically conductive support, optimum electrical and thermal conduction conditions are present.

We claim:

1. A half-bridge configuration, comprising:
   a load;
   two transistors having path electrodes, including a first transistor with a path electrode and a second transistor with a path electrode, said first transistor connected in series with said second transistor by said path electrodes being connected to one another and defining a series circuit, an operating voltage can be impressed across said series circuit and said load being connected to said path electrodes of said two transistors, said two transistors being of opposite conductivity types and formed as chips each having a rear side; and
   a common electrically conductive support receiving and supporting said rear side of each of said chips such that said path electrode of said first transistor being connected to a same one of said path electrode of said second transistor, and said common electrically conductive support forms a summation point, and said load connected to one of said common electrically conductive support and said summation point.

2. The half-bridge configuration according to claim 1, wherein said common electrically conductive support is produced from metal.

3. The half-bridge configuration according to claim 1, wherein said first transistor is a P-MOS field-effect transistor, said second transistor is an N-MOS field-effect transistor, said path electrodes are drain electrodes and said drain electrode of said second transistor is connected to said drain electrode of said first transistor and to said common electrically conductive support.

4. The half-bridge configuration according to claim 1, including a drive circuit for generating control signals for controlling said two transistors, said two transistors each having a gate electrode connected to said drive circuit.

5. The half-bridge configuration according to claim 4, wherein said drive circuit is a chip disposed in an electrically insulated manner on one of said two transistors.

6. The half-bridge configuration according to claim 5, wherein said chip forming said drive circuit is seated on that transistor of said two transistors which has a higher impedance.

7. The half-bridge configuration according to claim 6, wherein one of said two transistors is a P conductivity type and said chip forming said drive circuit IC is seated on said one of said two transistor of said P conductivity type.

8. The half-bridge configuration according to claim 1, wherein said common electrically conductive support is seated on said load for attaining an optimum electrical and thermal connection.

9. The half-bridge configuration according to claim 1, wherein said load has a first terminal and a second terminal, and in an unidirectional operation said second terminal of said load is connected to one of the operating voltage and ground.

10. The half-bridge configuration according to claim 1, wherein said two transistors are constructed using vertical technology.

11. The half-bridge configuration according to claim 4, including a temperature monitoring circuit integrated in said chip forming said drive circuit for protecting the half-bridge configuration against destruction.

12. The half-bridge configuration according to claim 9, including:
   a third transistor; and
   a fourth transistor connected in series with said third transistor and defining a further summation point at a connection point of said third transistor to said fourth transistor, and said second terminal of said load is connected to said further summation point providing a bi-directional operation.

13. A half-bridge configuration, comprising:
   two transistors having path electrodes, including a first transistor with a path electrode and a second transistor with a path electrode, said first transistor connected in series with said second transistor by said path electrodes being connected to one another and defining a series circuit, an operating voltage can be impressed across said series circuit and a load can be connected to said path electrodes of said two transistors, said two transistors being of opposite conductivity types and said two transistors formed as chips each having a rear side; and
   a common electrically conductive support receiving and supporting said rear side of each of said chips such that said path electrode of said first transistor being connected to a same one of said path electrode of said second transistor, and said common electrically conductive support forms a summation point, and the load can be connected to one of said common electrically conductive support and said summation point.

* * * * *